(12) United States Patent
Hu et al.

(10) Patent No.: US 10,651,827 B2
(45) Date of Patent: May 12, 2020

(54) APPARATUS AND METHOD FOR ACTIVATING CIRCUITS

(71) Applicant: Marvell World Trade Ltd., St. Michael (BB)

(72) Inventors: Yafei Hu, Shanghai (CN); Liu Han, Shanghai (CN); Kapil Jain, Santa Clara, CA (US); Jin Xie, Longmont, CO (US)

(73) Assignee: MARVELL ASIA PTE, LTD., Singapore (SG)

( * ) Notice: Subject to any disclaimer, the term of this patent is extended or adjusted under 35 U.S.C. 154(b) by 249 days.

(21) Appl. No.: 15/364,420

(22) Filed: Nov. 30, 2016

(65) Prior Publication Data

US 2017/0155378 A1  Jun. 1, 2017

Related U.S. Application Data

(60) Provisional application No. 62/261,665, filed on Dec. 1, 2015.

(51) Int. Cl.
| | |
|---|---|
| *H03K 3/012* | (2006.01) |
| *G06F 1/324* | (2019.01) |
| *G06F 1/3287* | (2019.01) |
| *G06F 1/3231* | (2019.01) |
| *G10L 15/10* | (2006.01) |
| *G10L 25/21* | (2013.01) |
| *G10L 25/78* | (2013.01) |

(Continued)

(52) U.S. Cl.
CPC ............. *H03K 3/012* (2013.01); *G06F 1/324* (2013.01); *G06F 1/3231* (2013.01); *G06F 1/3287* (2013.01); *G10L 15/10* (2013.01); *G10L 25/21* (2013.01); *G10L 25/78* (2013.01); *H03K 5/15013* (2013.01); *H03L 3/00* (2013.01); *H04R 3/00* (2013.01); *G10L 2015/088* (2013.01); *H03K 19/0016* (2013.01); *H04R 2201/003* (2013.01); *Y02D 10/171* (2018.01); *Y02D 10/173* (2018.01)

(58) Field of Classification Search
CPC .... H03K 3/012; H03K 5/15013; G06F 1/324; H04R 3/00; G10L 25/78; H03L 3/00
See application file for complete search history.

(56) References Cited

U.S. PATENT DOCUMENTS

| | | | |
|---|---|---|---|
| 5,625,843 A * | 4/1997 | Lee ........................... | G06F 3/16 704/201 |
| 2002/0116186 A1 * | 8/2002 | Strauss ................... | G10L 25/78 704/233 |

(Continued)

*Primary Examiner* — Jaweed A Abbaszadeh
*Assistant Examiner* — Gayathri Sampath (57) ABSTRACT

Aspects of the disclosure include an apparatus that has a first clock generator and a second clock generator. The first clock generator is configured to drive a first circuit, causing the first circuit to (i) receive a signal corresponding to an audio input, and (ii) determine whether an energy level of the signal exceeds a predetermined threshold. The second clock generator is activated when the first circuit determines that the energy level of the signal exceeds the predetermined threshold. The second clock generator is configured to drive a second circuit, causing the second circuit to determine whether the signal matches a predetermined pattern. A third circuit is activated when the second circuit determines that the signal matches the predetermined pattern.

20 Claims, 7 Drawing Sheets

(51) Int. Cl.
    *H04R 3/00*     (2006.01)
    *H03K 5/15*     (2006.01)
    *H03L 3/00*     (2006.01)
    *G10L 15/08*     (2006.01)
    *H03K 19/00*     (2006.01)
    *G06F 1/04*     (2006.01)

(56) References Cited

U.S. PATENT DOCUMENTS

| | | | | |
|---|---|---|---|---|
| 2006/0161430 | A1* | 7/2006 | Schweng | G10L 25/78 704/233 |
| 2009/0036173 | A1* | 2/2009 | Rofougaran | G06F 1/3203 455/574 |
| 2012/0054383 | A1* | 3/2012 | Lindahl | G06F 1/3215 710/57 |
| 2013/0339028 | A1* | 12/2013 | Rosner | G10L 15/222 704/275 |
| 2014/0163978 | A1* | 6/2014 | Basye | G10L 15/28 704/233 |
| 2014/0343949 | A1* | 11/2014 | Huang | H04R 1/08 704/275 |
| 2014/0358552 | A1* | 12/2014 | Xu | G10L 25/78 704/275 |
| 2016/0066113 | A1* | 3/2016 | Elkhatib | H04R 29/004 381/56 |
| 2016/0148615 | A1* | 5/2016 | Lee | G10L 15/22 704/275 |
| 2016/0240193 | A1* | 8/2016 | Gulati | G10L 15/28 |

\* cited by examiner

APPARATUS AND METHOD FOR ACTIVATING CIRCUITS

INCORPORATION BY REFERENCE

This present disclosure claims the benefit of U.S. Provisional Application No. 62/261,665, "Multiple Step Keyword Recognition" filed on Dec. 1, 2015, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In many applications, a user device, such as a computer, smart phone, tablet, wearable device, smart appliances, car infotainment system, or the like, is configured to operate at different power modes corresponding to different power consumption levels in order to extend the battery life of the user device by reducing the overall power consumption by the user device. Implementing different power modes in a user device may include activating or deactivating different circuits or components of the user device or adjusting the frequencies of clock signals that drive various circuits of the user device. For example, a lower power mode may correspond to fewer activated circuits or components and/or a lower clock frequency than a higher power mode. The user device may be instructed to switch from a lower power mode to one or more higher power modes according to one or more approaches, such as detecting whether an audio input received by the user device matches a predetermined sound pattern.

SUMMARY

Aspects of the disclosure provide an apparatus that has a first clock generator and a second clock generator. The first clock generator is configured to drive a first circuit, causing the first circuit to (i) receive a signal corresponding to an audio input, and (ii) determine whether an energy level of the signal exceeds a predetermined threshold. The second clock generator is activated when the first circuit determines that the energy level of the signal exceeds the predetermined threshold. The second clock generator is configured to drive a second circuit, causing the second circuit to determine whether the signal matches a predetermined pattern. A third circuit is activated when the second circuit determines that the signal matches the predetermined pattern.

In an embodiment, the apparatus further includes a power management circuit that is configured to receive a first result from the first circuit that indicates whether the energy level of the signal corresponding to the audio input exceeds the predetermined threshold, activate the second clock generator when the first result indicates that the energy level of the signal exceeds the predetermined threshold, receive a second result from the second circuit that indicates whether the signal matches the predetermined pattern, and activate the third circuit when the second result indicates that the signal matches the predetermined pattern.

In an embodiment, the first circuit includes a filter configured to generate down-sampled data based on data that represent the signal, and an energy calculator configured to generate an energy detection signal that indicates whether the energy level of the signal exceeds the predetermined threshold based on the down-sampled data.

In an embodiment, the energy calculator includes a squarer circuit configured to calculate squared down-sampled data, an integrator circuit configured to generate a detected energy level by integrating the squared down-sampled data, and a threshold comparator configured to generate the energy detection signal by comparing the detected energy level with the predetermined threshold.

In an embodiment, the first circuit includes a multiplexer configured to receive a first clock signal from the first clock generator and a second clock signal from the second clock generator and selectively pass one of the first and clock signals to drive the energy calculator.

Also, the first circuit may generate down-sampled data by down-sampling data that represent the signal. The second circuit may receive the down-sampled data from the first circuit, and generate a pattern matching signal by comparing the down-sampled data with the predetermined pattern.

In an embodiment, a power consumption level of the first clock is less than a power consumption level of the second clock generator. Furthermore, the first clock generator may be a ring-oscillator, and the second clock generator may be a phase locked loop clock generator.

In an embodiment, the second circuit further includes a clock calibrator configured to adjust a setting of the first clock generator based on comparing a first clock signal from the first clock generator and a second clock signal from the second clock generator.

Aspects of the disclosure provide a method of activating various circuits. The method includes receiving a signal corresponding to an audio input, causing a first circuit, by driving the first circuit with a first clock generator, to determine whether an energy level of the signal exceeds a predetermined threshold, activating a second clock generator when the first circuit determines that the energy level of the signal exceeds the predetermined threshold, causing a second circuit, by driving the second circuit with the second clock generator, to determine whether the signal matches a predetermined pattern, and activating a third circuit when the second circuit determines that the signal matches the predetermined pattern.

In an embodiment, the method further includes receiving a first result from the first circuit that indicates whether the energy level of the signal corresponding to the audio input exceeds the predetermined threshold, activating the second clock generator when the first result indicates that the energy level of the signal exceeds the predetermined threshold, receiving a second result from the second circuit that indicates whether the signal matches the predetermined pattern, and activating the third circuit when the second result indicates that the signal matches the predetermined pattern.

The method may further include generating down-sampled data by down-sampling data that represent the signal, and generating an energy detection signal that indicates whether the energy level of the signal exceeds the predetermined threshold based on the down-sampled data.

In an embodiment, the method may include generating, by an energy calculator, an energy detection signal that indicates whether the energy level of the signal exceeds the predetermined threshold, and selectively passing one of a first clock signal from the first clock generator and a second clock signal from the second clock generator to drive the energy calculator.

The method may include generating down-sampled data by down-sampling data that represent the signal, and generating a pattern matching signal by comparing the down-sampled data with the predetermined pattern. The method may also include adjusting a setting of the first clock generator based on comparing a first clock signal from the first clock generator and a second clock signal from the second clock generator.

Aspects of the disclosure provide a non-transitory computer-readable medium storing instructions that, when executed by a processing circuit, cause the processing circuit to perform operations. The operations by executing the instructions include receiving a first result from a first circuit that is driven by a first clock generator, the first result indicating whether an energy level of a signal corresponding to an audio input exceeds a predetermined threshold, activating a second clock generator when the first result indicates that the energy level of the signal exceeds the predetermined threshold, receiving a second result from a second circuit driven by the second clock generator, the second result indicating whether the signal matches a predetermined pattern, and activating a third circuit when the second result indicates that the signal matches the predetermined pattern.

In an embodiment, the operations by executing the instructions further include setting a multiplexer to selectively pass one of a first clock signal from the first clock generator and a second clock signal from the second clock generator to drive the first circuit based on the first result.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

According to one or more embodiments of the present disclosure, a main circuit of a user device may be activated when an audio input matches a predetermined sound pattern. The user device can use a less power-consuming clock generator to drive an energy calculator and to use a more power-consuming clock generator to drive a pattern detector when the energy calculator determines that the audio input has an energy level exceeding a predetermined threshold. The user device can activate the main circuit when the pattern detector determines that the audio input matches the predetermined sound pattern. As such, a sound pattern based activation functionality of a user device according to one or more embodiments of the present disclosure is implemented in a multi-step approach to further reduce the power consumption of the user device.

Figure 1:
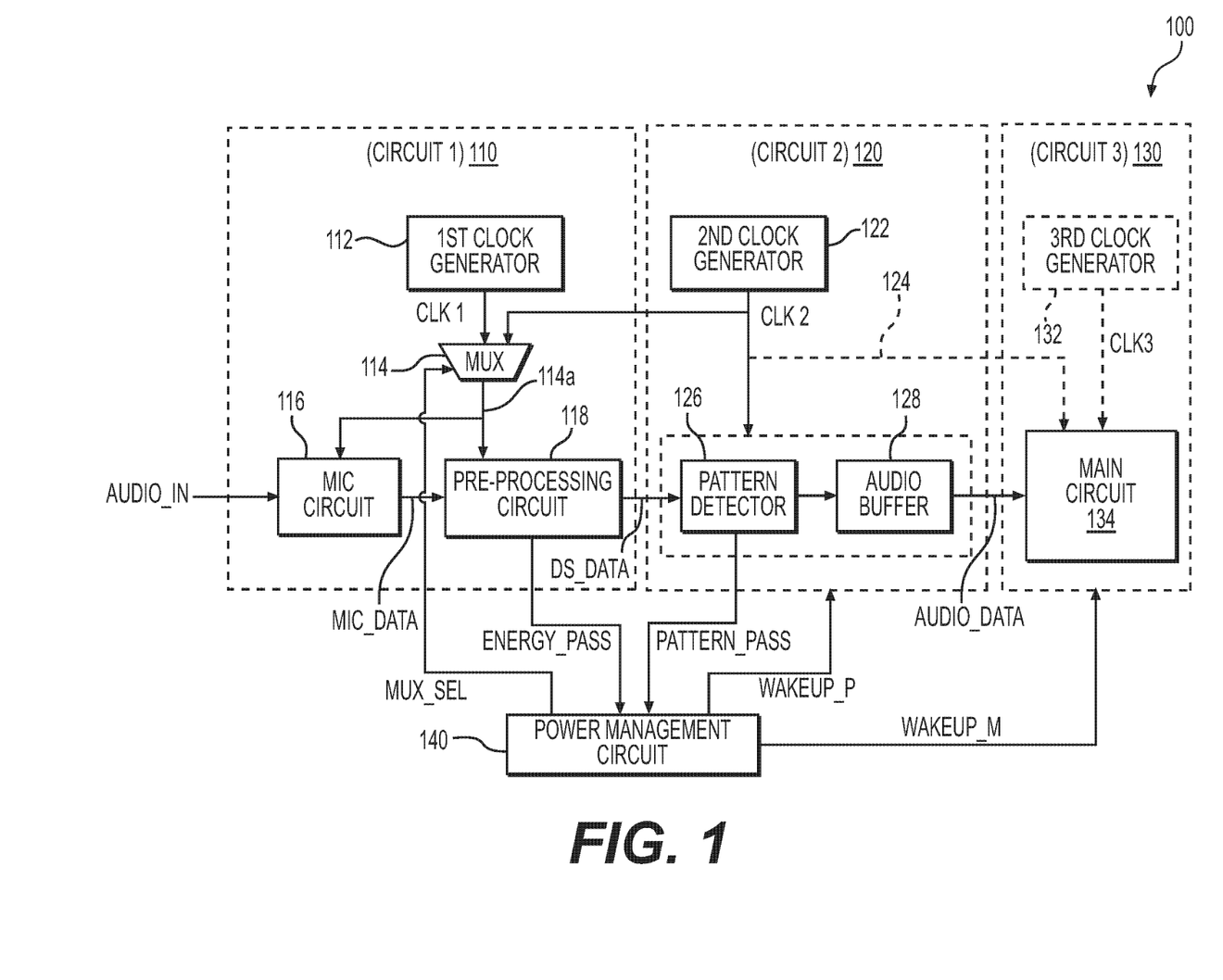
FIG. 1 shows a functional block diagram of a user device according to an embodiment of the disclosure.

FIG. 1 shows a functional block diagram of a user device 100 according to an embodiment of the disclosure. In some examples, the user device 100 may be a computer, smart phone, tablet, wearable device, smart appliances, car infotainment system, or the like.

The user device 100 includes a first circuit 110 (Circuit 1), second circuit 120 (Circuit 2), a third circuit 130 (Circuit 3), and a power management circuit 140. The first circuit 110 receives a signal AUDIO_IN corresponding to an audio input and outputs down-sampled data DS_DATA, generated by down-sampling data that represent the signal AUDIO_IN, to the second circuit 120. The first circuit 110 also generates an energy-detecting signal ENERGY_PASS corresponding to a result of whether an energy level of the signal AUDIO_IN exceeds a predetermined threshold and outputs the energy-detecting signal ENERGY_PASS to the power management circuit 140. In some examples, the predetermined threshold corresponds determining whether the energy level of the signal AUDIO_IN is sufficiently large such that the signal AUDIO_IN results more likely from a user input than a noise. The second circuit 120 receives and processes the down-sampled data DS_DATA and outputs the resulting data AUDIO_DATA to the third circuit 130. The second circuit 120 also generates a pattern-matching signal PATTERN_PASS corresponding to a result of whether the signal AUDIO_IN matches a predetermined pattern. In some examples, the predetermined pattern corresponds to a waveform of a vocal or musical sound, for example, a result of a user enunciating a keyword.

The third circuit 130 receives and processes the resulting data AUDIO_DATA from the second circuit 120. Furthermore, the power management circuit 140 receives the energy-detecting signal ENERGY_PASS and generates a peripheral wakeup signal WAKEUP_P that activates the second circuit 120 based on the energy-detecting signal ENERGY_PASS. The power management circuit 140 also receives the pattern-matching signal PATTERN_PASS and generates a main wakeup signal WAKEUP_M that activates the third circuit 130 based on the signal PATTERN_PASS. In addition, the power management circuit 140 further generates a multiplexer selection signal MUX_SEL that selects a suitable clock signal for driving the first circuit.

In some examples, one or more of the first circuit 110, second circuit 120, third circuit 130, power management circuit 140, and corresponding circuits and components therein are formed in an integrated circuit (IC) chip, various IC chips, or various IC chips in a same IC package.

The first circuit 110 includes a first clock generator 112, a multiplexer 114 (MUX), a microphone circuit 116 (MIC Circuit), and a pre-processing circuit 118. In some examples, the first circuit 110 is activated whenever the user device 100 is powered up.

The first clock generator 112 generates a first clock signal CLK1. In some examples, the first clock generator 112 is a clock generator based on a ring-oscillator, resistor-capacitor oscillator, inductor-capacitor oscillator, crystal capacitor, or the like. In some examples, the first clock generator 112 does not have a built-in real-time feedback control for adjusting the first clock signal CLK1. In some examples, the first clock generator 112 is integrated with other components of the first circuit 110 on the IC chip. In one example, the first clock generator 112 is disposed outside the IC chip.

The multiplexer 114 receives the first clock signal CLK1 and a second clock signal CLK2 from the second circuit 120 and selectively passes one of the first clock signal CLK1 and second clock signal CLK2 to an output 114a of the multiplexer 114 in response to the multiplexer selection signal MUX_SEL from the power management circuit 140. The clock signal at the output 114a of the multiplexer 114 is used to drive the microphone circuit 116 and pre-processing circuit 118.

The microphone circuit 116 receives the signal AUDIO_IN and generates digital microphone output data MIC_DATA that represent the waveforms of the signal AUDIO_IN. In some examples, the microphone circuit 116 includes a microphone, a driver that drives the microphone, and an analog-to-digital converter that converts an output signal from the microphone from an analog form into a digital form. In some examples, the microphone circuit 116 is integrated with other components of the first circuit 110 on an IC chip. In other examples, the microphone circuit 116 is disposed outside the IC chip. In at least one example, the microphone of the microphone circuit 116 is a microelectromechanical system (MEMS) microphone.

The pre-processing circuit 118 receives the digital microphone output data MIC_DATA that represent the signal AUDIO_IN and outputs down-sampled data DS_DATA by down-sampling the digital microphone output data MIC_DATA. In some examples, the sample rate of the data MIC_DATA ranges from 10 MHz to 50 MHz; and the sample rate of the down-sampled data DS_DATA ranges from 10 kHz to 50 kHz. Moreover, the pre-processing circuit 118 also determines whether the energy level of the signal AUDIO_IN, as represented by the digital microphone output data MIC_DATA, exceeds the predetermined threshold and generates the energy-detecting signal ENERGY_PASS to report the determination result to the power management circuit 140. In some examples, the pre-processing circuit 118 sets the energy-detecting signal ENERGY_PASS to a first logical value, such as a logical high, when the pre-processing circuit 118 determines that the energy level of the signal AUDIO_IN exceeds the predetermined threshold and to a second logical value, such as a logical low, when the pre-processing circuit 118 determines that the energy level of the signal AUDIO_IN does not exceed the predetermined threshold.

The second circuit 120 includes a second clock generator 122 and an audio processing circuit 124, which includes a pattern detector 126 and an audio buffer 128. In some examples, the second circuit 120 is inactive when the user device 110 is at a lower power mode and is activated in response to the peripheral wakeup signal WAKEUP_P from the power management circuit 140. In some examples, the second circuit 120 is activated by driving the second circuit 120 with the second clock signal CLK2, or supplying an electricity power to the second circuit 120, or other suitable measures in response to the peripheral wakeup signal WAKEUP_P.

There may be other component in the second circuit 120. In some examples, one or more of the second clock generator 122, pattern detector 126, and an audio buffer 128, and one or more components of the first circuit 110 are formed in an integrated circuit (IC) chip or various IC chips in a same IC package.

The second clock generator 122 generates the second clock signal CLK2. In some examples, the second clock generator 122 is a clock generator based on a phase-locked loop. In some examples, the second clock generator 122 has a built-in real-time feedback control for adjusting the second clock signal CLK2. The second clock generator 122 may have greater frequency accuracy or stability over process, voltage, or temperature variations of the user device 100 than the first clock generator 112. In some examples, the second clock signal CLK2 has a higher frequency than the first clock signal CLK1. In some examples, the second clock generator 122 is integrated with other components of the second circuit 120 on an IC chip or disposed outside the IC chip.

The pattern detector 126 receives the down-sampled data DS_DATA from the first circuit 110 and determines whether the signal AUDIO_IN, as represent by the down-sampled data DS_DATA, matches a predetermined pattern based on the down-sampled data DS_DATA. The pattern detector 126 also generates the pattern-matching signal PATTERN_PASS to report the determination result to the power management circuit 140. The pattern detector 126 also stores information corresponding to the predetermined sound pattern, which is programmable by a user. In some examples, the pattern detector 126 sets the pattern-matching signal PATTERN_PASS to the first logical value when the pattern detector 126 determines that the signal AUDIO_IN matches the predetermined pattern and to the second logical value when the signal AUDIO_IN does not match the predetermined pattern.

The audio buffer 128 stores the down-sampled data DS_DATA as audio data AUDIO_DATA to be accessed by the third circuit 130. The down-sampled data DS_DATA may be temporarily stored in the audio buffer 128 and removed after being read out by the third circuit 130. In some examples, instead of storing the down-sampled data DS_DATA, the audio buffer 128 stores the resulting data after the down-sampled data DS_DATA are further processed by the pattern detector 126 or another circuit or component of the audio processing circuit 124 as the audio data AUDIO_DATA. The further processing of the down-sampled data DS_DATA by the audio processing circuit 124 may include a noise cancellation process, audio equalization process, amplification process, or the like. In at least one example, the audio buffer 128 is configured to hold at least the amount of audio data AUDIO_DATA corresponding to a duration from the activation of the second circuit 120 to the activation of the third circuit 130, should the pattern detector 126 determines that the signal AUDIO_IN matches the predetermined pattern.

The third circuit 130 includes a third clock generator 132 and a main circuit 134. In some examples, the third circuit 130 is inactive when the user device 110 is at the lower power mode and is activated in response to the main wakeup signal WAKEUP_M from the power management circuit 140. In some examples, the third circuit 130 is activated by driving the third circuit 130 with the third clock signal CLK3, or supplying an electricity power to the third circuit 130, or other suitable measures in response to the main wakeup signal WAKEUP_M.

The third clock generator 132 generates the third clock signal CLK3. In some examples, the third clock generator 132 is a clock generator based on a phase-locked loop. In some examples, the third clock signal CLK3 has a higher frequency than the second clock signal CLK2. In some examples, the third clock generator 132 is integrated with other components of the third circuit 130 on an IC chip or disposed outside the IC chip. In at least one example, the main circuit 134 is driven by the second clock signal CLK2, and the third clock generator 132 is thus omitted.

The main circuit 130 is configured to access the audio data AUDIO_DATA stored in the audio buffer 128 and perform at least one function based on the audio data AUDIO_DATA, such as recording, playback, speech recognition, or transmission of the audio data AUDIO_DATA, or the like. The main circuit 130 may access the audio buffer 128 through a bus compliance with an interface standard including Inter-Integrated Circuit (I2C), Serial Peripheral Interface (SPI), Universal Asynchronous Receiver/Transmitter (UART), or the like. In some examples, the main circuit 134 includes one or more of a hard-wired circuit, processor, memory, input/output interface, communication interface, or the like.

The power management circuit 140 receives the energy-detecting signal ENERGY_PASS from the first circuit 110 that indicates a result of whether the energy level of the signal AUDIO_IN exceeds the predetermined threshold. The power management circuit 140 activates the second clock generator 122, audio processing circuit 124, and/or other components of the second circuit 120 when the result indicates that the energy level of the signal AUDIO_IN exceeds the predetermined threshold. For example, the power management circuit 140 outputs the peripheral wakeup signal WAKEUP_P to activate the second circuit 120 when the result indicates that the energy level of the signal AUDIO_IN exceeds the predetermined threshold. The power management circuit 140 also outputs the multiplexer selection signal MUX_SEL that instructs the multiplexer 114 to select the first clock signal CLK1 prior to determining that the energy level of the signal AUDIO_IN exceeds the predetermined threshold, and to select the second clock signal CLK2 after determining that the energy level of the signal AUDIO_IN exceeds the predetermined threshold.

The power management circuit 140 also receives the pattern-matching signal PATTERN_PASS from the second circuit 120 that indicates a result of whether the signal AUDIO_IN matches the predetermined pattern. The power management circuit 140 activates the third circuit 130 when the result indicates that the signal AUDIO_IN matches the predetermined pattern. For example, the power management circuit 140 outputs the main wakeup signal WAKEUP_M to activate the third circuit 130 when the result indicates that the signal AUDIO_IN matches the predetermined pattern.

During operation, in at least one example, when the user device 110 is at a lower power mode, the first circuit 110 is activated and the second and third circuits 120 and 130 are deactivated. The first clock generator 112 generates the first clock signal CLK1 that drives the microphone circuit 116 and the pre-processing circuit 118. After a user provides an audio input by speaking a word, the microphone circuit 116 picks up the signal AUDIO_IN corresponding to the audio input and outputs the corresponding digital microphone data MIC_DATA. The pre-processing circuit 118 determines whether the signal AUDIO_IN, as represented by the microphone data MIC_DATA, has an energy level exceeding the predetermined threshold. Once the power management circuit 140 receives the result that the energy level of the signal AUDIO_IN exceeds the predetermined threshold, the power management circuit 140 activates the second clock generator 122 by the peripheral wakeup signal WAKEUP_P. The audio processing circuit 124 may be activated by the peripheral wakeup signal WAKEUP_P or indirectly by the activity of the second clock signal CLK2 after the second clock generator 122 is activated. The power management circuit 140 also sets the multiplexer 114 to use the second clock signal CLK2 to drive the microphone circuit 116 and the pre-processing circuit 118 after the second clock generator 122 is activated.

Moreover, after the second circuit 120 is activated, the pattern detector 126 receives the down-sampled data DS_DATA and determines whether the signal AUDIO_IN, as now represented by the down-sampled data DS_DATA, matches the predetermined pattern. If the power management circuit 140 receives the result that the signal AUDIO_IN matches the predetermined pattern, the power management circuit 140 determines that the user has read the predetermined keyword to the user device 100 and thus activates the third circuit 130 through the main wakeup signal WAKEUP_P, and the user device 100 thus switches from the lower power mode to a higher power mode. If the power management circuit 140 receives the result that the signal AUDIO_IN does not match the predetermined pattern, the power management circuit 140 determines that the user has not read the predetermined keyword to the user device 100 and thus deactivates the second circuit 120 through the peripheral wakeup signal WAKEUP_P, and the user device 100 remains at the lower power mode.

In an embodiment according to the present disclosure, because the first circuit 110 is driven by a less precise and/or slower clock signal (e.g., the first clock signal CLK1) generated by a less power-consuming clock generator (e.g., the first clock generator 112) during a lower power mode, a more accurate, faster, and hence more power-consuming clock generator (e.g., the second clock generator 122) can remain deactivated during the lower power mode. Therefore, compared with a configuration that the first clock generator 112 is omitted and the second clock generator 122 is activated all the time when the user device is powered up, the overall power consumption of the user device 100 according to the present disclosure can be reduced by introducing a less power-consuming clock generator 112 during the lower power mode and activating the second clock generator 122 only after such activation is justified by detecting the energy level of the audio input AUDIO_IN exceeding the predetermined threshold.

The pre-processing circuit 118, the pattern detector 126, or the power management circuit may be implemented as one or more of a hard-wired circuit, programmable controller, or processor executing software or firmware instructions, or the like.

Figure 2:
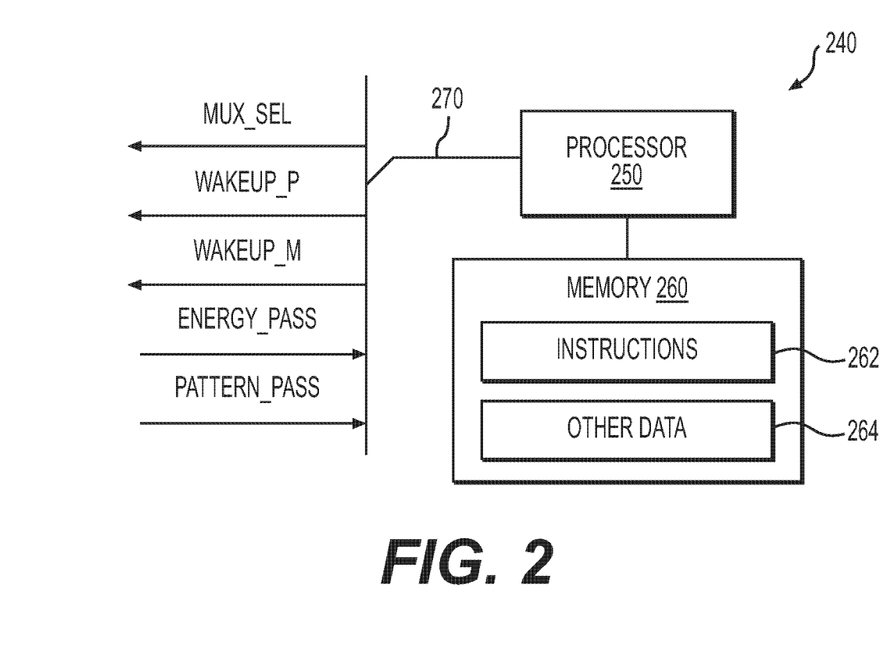
FIG. 2 shows a functional block diagram of a power management circuit of the user device in FIG. 1 according to an embodiment of the disclosure.

FIG. 2 shows a functional block diagram of a power management circuit 240 of a user device according to an embodiment of the disclosure. In some examples, the power management circuit 240 corresponds to the power management circuit 140 of the user device 100. Components in FIG. 2 that are the same or similar to the components in FIG. 1 are given the same reference labels, and detailed description thereof is omitted.

In the example depicted in FIG. 2, the power management circuit 240 is implemented as a processor 250 executing corresponding software or firmware instructions 262 stored in a memory 260. The power management circuit 240 includes the processor 250, the memory 260 coupled with the processor 250, and a bus 270. The processor 250 receives, through the bus 270, various signals and data, such as the energy-detecting signal ENERGY_PASS from the first circuit 110 and the pattern-matching signal PATTERN_PASS from the second circuit 120. The processor 250 outputs, through the bus 270, various signals and data, such as the multiplexer selection signal MUX_SEL to the first circuit 110, the peripheral wakeup signal WAKEUP_P to the second circuit 120, and the main wakeup signal WAKE-UP_M to the third circuit 130.

In some examples, the processor 250 includes a single or multiple processing cores configured to execute the instructions 262, or an application-specific controller configured to perform various functions based on the instructions 262. The memory 260 is used to store the instructions 262 and/or other data or intermediate data 264. In some examples, the memory 260 includes a non-transitory computer readable medium, such as a semiconductor or solid-state memory, a random access memory (RAM), a read-only memory (ROM), or other suitable storage medium. In some examples, the memory 260 includes a non-volatile memory, a volatile memory, or a combination thereof.

Figure 3:
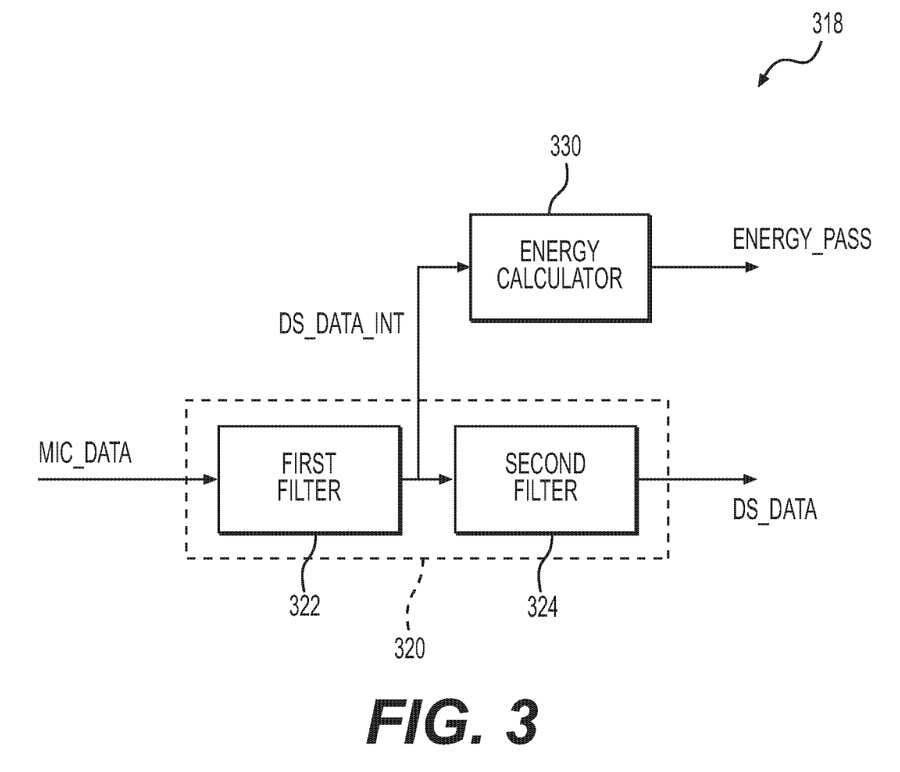
FIG. 3 shows a functional block diagram of a pre-processing circuit of the user device in FIG. 1 according to an embodiment of the disclosure.

FIG. 3 shows a functional block diagram of a pre-processing circuit 318 of a user device according to an embodiment of the disclosure. In some examples, the pre-processing circuit 318 corresponds to the pre-processing circuit 118 of the user device 100. Components in FIG. 3 that are the same or similar to the components in FIG. 1 are given the same reference labels, and detailed description thereof is omitted.

The pre-processing circuit 318 includes a down-sampling filter 320 and an energy calculator 330. The down-sampling filter 320 receives the digital microphone data MIC_DATA from the microphone circuit 116 and output down-sampled data DS_DATA to the second circuit 120 by down-sampling the data MIC_DATA. The down-sampling filter 320 also outputs intermediate down-sampled data DS_DATA_INT to the energy calculator 330. The energy calculator 330 determines whether the data AUDIO_IN, as represented by the intermediate down-sampled data DS_DATA_INT, has an energy level exceeding the predetermined threshold. The energy calculator 330 outputs the energy-detecting signal ENERGY_PASS to report the determination result to the power management circuit 140.

The down-sampling filter 320 as depicted in FIG. 3 includes a first filter 322 and a second filter 324. The first filler 322 receives the data MIC_DATA and generates the intermediate down-sampled data DS_DATA_INT by down-sampling the data MIC_DATA. In some examples, the first filler 322 simply outputs one sample among every predetermined number of samples of the data MIC_DATA as the intermediate down-sampled data DS_DATA_INT and ignore other sample(s). The second filler 324 receives the intermediate down-sampled data DS_DATA_INT and generates the down-sampled data DS_DATA by further processing the intermediate down-sampled data DS_DATA_INT. In some examples, the second filler 324 performs one or more of a down-sampling process, anti-aliasing filtering process, equalization process, noise cancellation process, or the like, on the intermediate down-sampled data DS_DATA_INT. In some examples, the second filler 324 is configured to have a processing time sufficient to cover the processing time of the energy calculator 330 and the time the power management circuit 140 and the second circuit 120 takes to be fully activate the second circuit 120 accordingly. As such, the second circuit 120 can timely process the set of down-sampled data DS_DATA that corresponds to the set of intermediate down-sampled data DS_DATA_INT triggering the activation of the second circuit 120. In at least one example, the second filler 324 also includes a buffer (not shown) that is sufficient to temporarily retain the down-sampled data DS_DATA for the second circuit 120.

Figure 4:
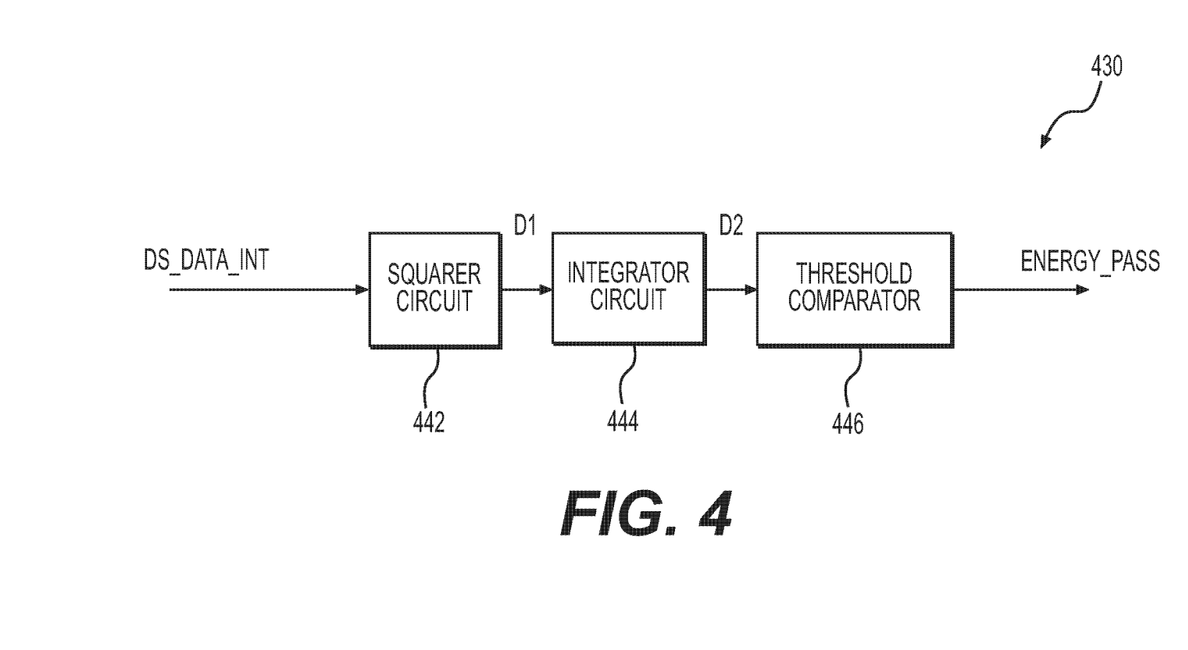
FIG. 4 shows a functional block diagram of an energy calculator of the pre-processing circuit in FIG. 3 according to an embodiment of the disclosure.

FIG. 4 shows a functional block diagram of an energy calculator 430 of a pre-processing circuit according to an embodiment of the disclosure. In some examples, the energy calculator 430 corresponds to the energy calculator 330 of pre-processing circuit 318. Components in FIG. 4 that are the same or similar to the components in FIG. 3 are given the same reference labels, and detailed description thereof is omitted.

The energy calculator 430 includes a squarer circuit 442, an integrator circuit 444, and a threshold comparator 446. The squarer circuit 442 receives the intermediate down-sampled data DS_DATA_INT and calculates squared down-sampled data $D_1$. The integrator circuit 444 receives the squared down-sampled data $D_1$ and generates a detected energy level $D_2$ by integrating the squared down-sampled data $D_1$. In some examples, the integrator circuit 444 resets every predetermined number of clock cycles such that the energy levels of noises picked up by the microphone circuit 116 as the signal AUDIO_IN are not accumulated at the integrator circuit 444.

The threshold comparator 446 compares the detected energy level $D_2$ and the predetermined threshold and outputs the energy-detecting signal ENERGY_PASS based on the comparison result. In some examples, the predetermined threshold is hard-wired or one-time programmed in the threshold comparator 446 or in a circuit accessible to the threshold comparator 446. In other examples, the predetermined threshold is reprogrammable and stored in the threshold comparator 446 or in a circuit accessible to the threshold comparator 446.

Figure 5:
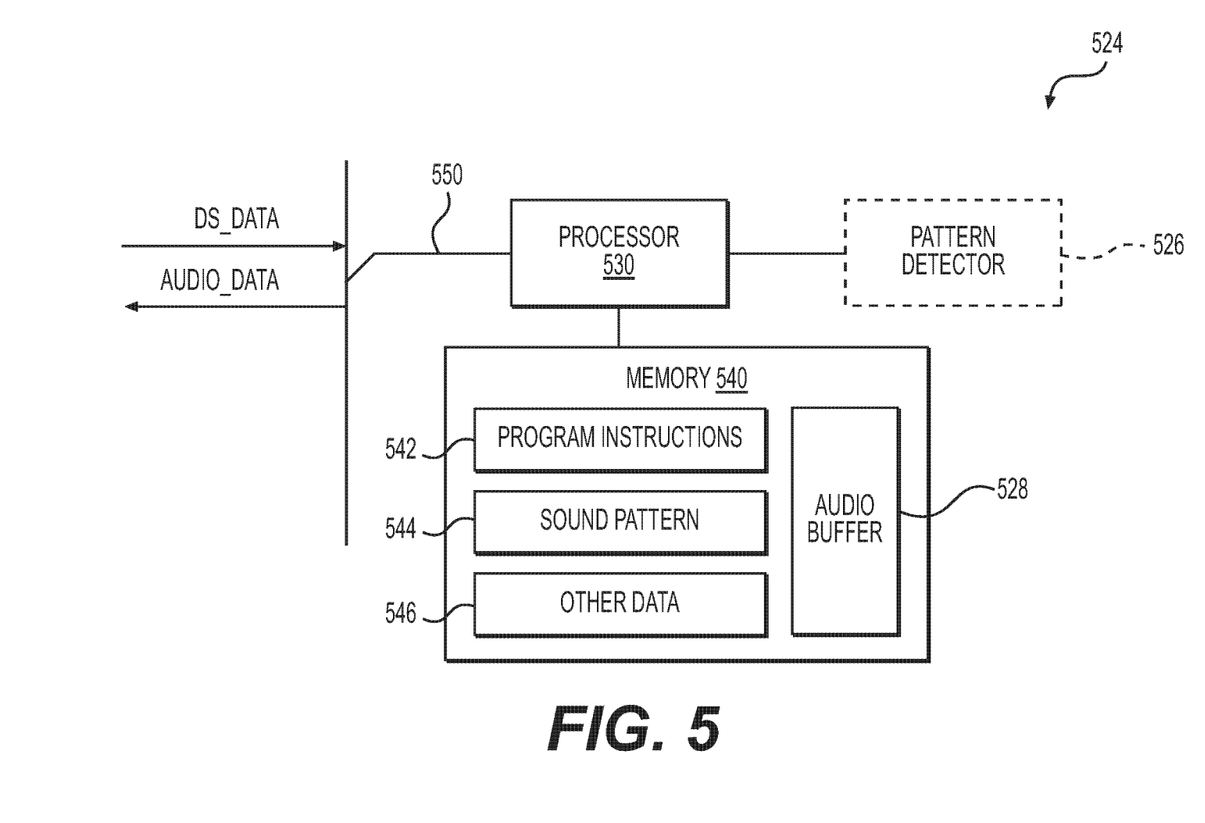
FIG. 5 shows a functional block diagram of an audio processing circuit of the user device in FIG. 1 according to an embodiment of the disclosure.

FIG. 5 shows a functional block diagram of an audio processing circuit 524 of a user device according to an embodiment of the disclosure. In some examples, the audio processing circuit 524 corresponds to the audio processing circuit 124 of the user device 100. The audio processing circuit 524 further includes a pattern detector 526 and an audio buffer 528 that correspond to the pattern detector 126 and the audio buffer 128, respectively. Components in FIG. 5 that are the same or similar to the components in FIG. 1 are given the same reference labels, and detailed description thereof is omitted.

In the example depicted in FIG. 5, the audio processing circuit 524 is implemented as a processor 530 executing corresponding software or firmware instructions 542 stored in a memory 540. The audio processing circuit 524 includes the processor 530, the memory 540 coupled with the processor 530, and a bus 550. The processor 530 receives, through the bus 550, the down-sampled data DS_DATA and outputs, through the bus 550, the audio data AUDIO_DATA. The pattern detector 526 is implemented as the processor 530 executing the instructions 542. The audio buffer 528 is implemented as a portion of the memory 540.

In some examples, the processor 530 includes a single or multiple processing cores configured to execute the instructions 542, or an application-specific controller configured to perform various functions based on the instructions 542. The memory 540 is used to store the instructions 542, the predetermined sound pattern 544 to be used by the pattern detector 526, and/or other data or intermediate data 546. In some examples, the memory 540 includes a non-transitory computer readable medium, such as a semiconductor or solid-state memory, a random access memory (RAM), a read-only memory (ROM), or other suitable storage medium. In some examples, the memory 540 includes a non-volatile memory, a volatile memory, or a combination thereof.

Figure 6:
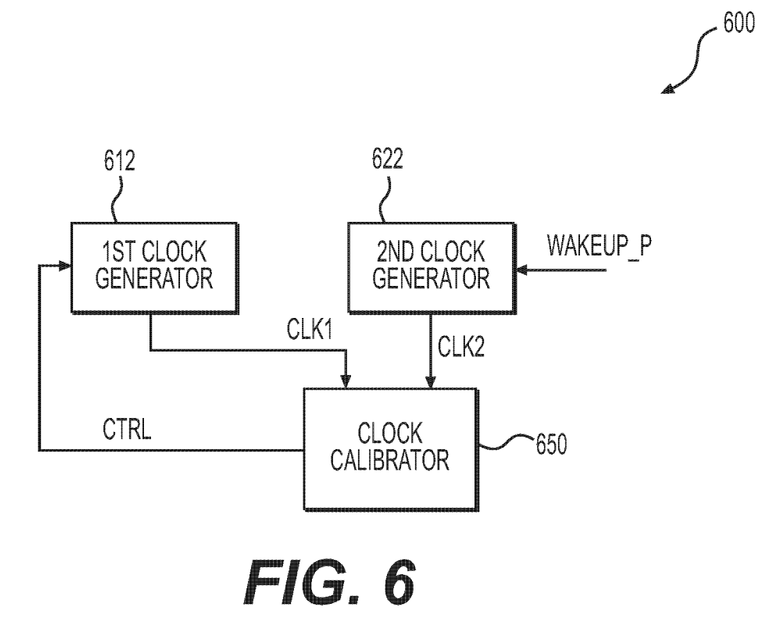
FIG. 6 shows a functional block diagram of a portion of another user device having a clock calibrator according to an embodiment of the disclosure.

FIG. 6 shows a functional block diagram of a portion of a user device 600 that includes a clock calibrator 650 according to an embodiment of the disclosure. The user device 600 includes a first clock generator 612, second clock generator 622, and the clock calibrator 650. In some examples, the user device 600 corresponds to the user device 100, the first clock generator 612 corresponds to the first clock generator 112, and the second clock generator 622 corresponds to the second clock generator 122, respectively. Other components of the user device 600 that are the same or similar to the components of the user device 100 are not depicted in FIG. 6.

Compared with the user device 100, the user device 600 further includes the clock calibrator 650. The clock calibrator 650 receives the first clock signal CLK1 from the first clock generator 612 and a second clock signal CLK2 from the second clock generator 622 and outputs a control signal CTRL to adjust a setting of the first clock generator 612 based on comparing the first clock signal CLK1 and the second clock signal CLK2. In some examples, the control signal CTRL may be an analog signal or a digital signal. In one example, the first clock generator 612 is a ring oscillator having pull-up or pull-down transistors that function as variable resistive devices. The oscillating frequency of the ring oscillator can be tuned by adjusting the equivalent resistance of the pull-up or pull-down transistors. In such example, the equivalent resistance of the pull-up or pull-down transistors can be controlled by either an analog signal applied to the gate terminals of the transistors or a digital signal that selectively turns on or off the transistors.

In some examples, the clock calibrator 650 is a stand-alone circuit of the second circuit 120 or an integrated portion of the audio processing circuit 124. In some examples, the clock calibrator 650 is a portion of the first circuit 110 or a portion of the power management circuit 140.

Figure 7:
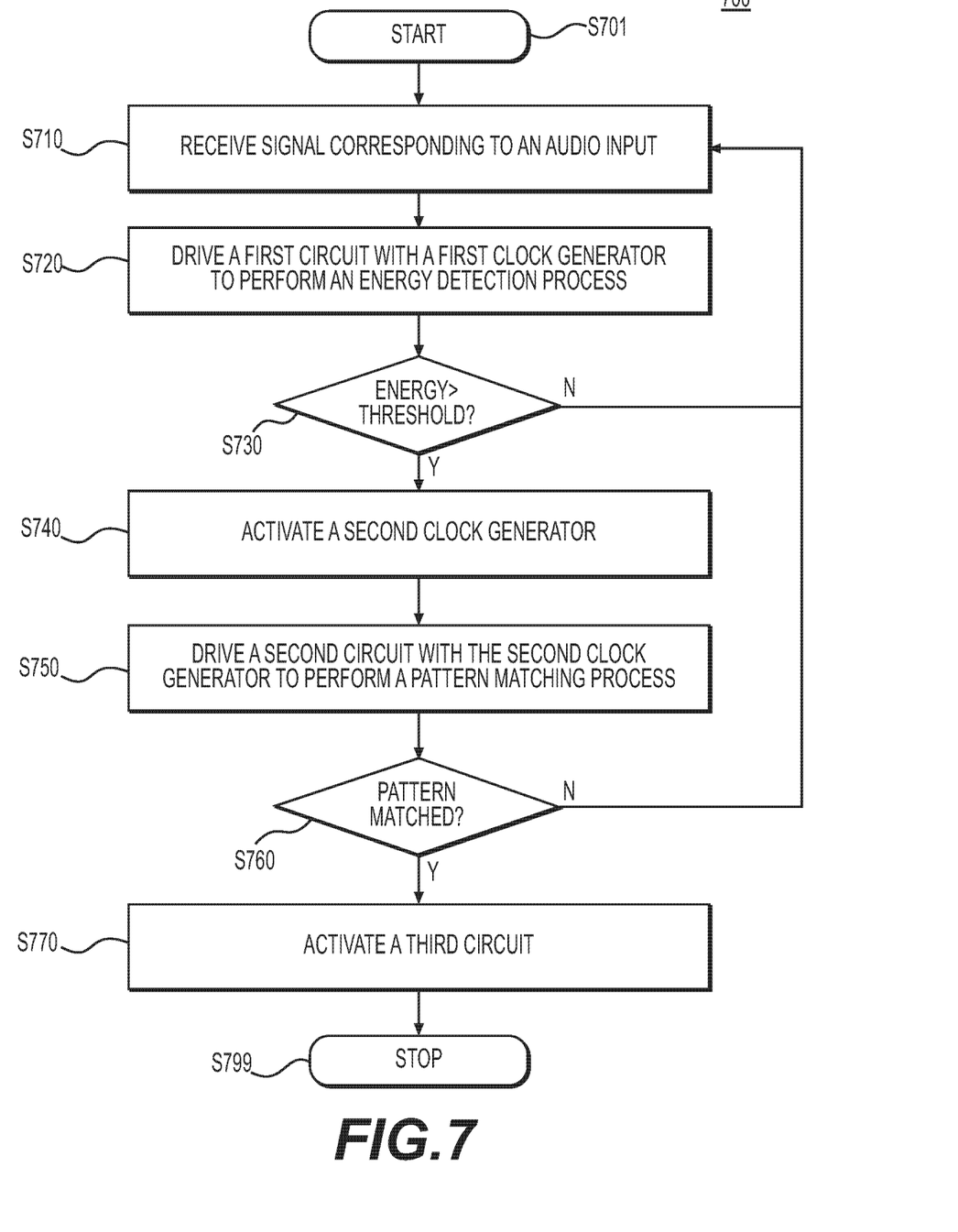
FIG. 7 shows a flow chart outlining a process of activating various circuits of the user device in FIG. 1 according to an embodiment of the disclosure.

FIG. 7 shows a flow chart outlining a process 700 of activating various circuits of a user device, such as circuits 120 and 130 of the user device 100, according to an embodiment of the disclosure. It is understood that additional operations may be performed before, during, and/or after the process 700 depicted in FIG. 7. The process 700 starts at S701 and proceeds to S710.

At S710, a signal corresponding to an audio input is received. For example, a microphone circuit 116 of a user device 100 receives a signal AUDIO_IN that corresponds to an audio input, such as a user enunciating a word to the user device 100.

At S720, a first clock generator drives a first circuit, causing the first circuit to determine whether an energy level of the signal exceeds a predetermined threshold. In some examples, the first clock generator is configured to generate a first clock signal whenever the user device is powered up.

For example, the first circuit 110 includes a first clock generator 112 generating a first clock signal CLK1 that derives the microphone circuit 116 and a pre-processing circuit 118 of the first circuit 110 when the user device 100 is at a lower power mode. The microphone circuit 116 outputs data MIC_DATA representing the signal AUDIO_IN. The pre-processing circuit 118 receives the data MIC_DATA and determines whether the signal AUDIO_IN, as represented by the data MIC_DATA, has an energy level greater than a predetermined threshold.

In some examples, down-sampled data are generated by down-sampling the data MIC_DATA, and the energy level of the signal AUDIO_IN is calculated based on the down-sampled data.

At S730, when the energy level of the signal is determined to be greater than the predetermined threshold, the process proceeds to S740. When the energy level of the signal is determined to be not greater than the predetermined threshold, the process proceeds to S710.

For example, pre-processing circuit 118 generates an energy-detecting signal ENERGY_PASS corresponding to a result of whether the energy level of the signal AUDIO_IN exceeds a predetermined threshold and outputs the energy-detecting signal ENERGY_PASS to the power management circuit 140. When the energy-detecting signal ENERGY_PASS corresponding to a result that the energy level of the signal AUDIO_IN exceeds the predetermined threshold, the power management circuit 140 activates the second clock generator 122 and the audio processing circuit 124 and will determine whether to further activate the third circuit 130 based on another result from the second circuit 120. When the energy-detecting signal ENERGY_PASS corresponding to a result that the energy level of the signal AUDIO_IN does not exceeds the predetermined threshold, the power management circuit 140 does not activate the second or third circuit 120 or 130, and the user device 100 remains at the lower power mode.

A S740, a second clock generator is activated. The second clock generator is configured to generate a second clock signal to drive a second circuit. In some examples, the second clock signal has a higher frequency than the first clock signal. In some examples, the second clock generator has greater frequency accuracy and/or stability over process, voltage, or temperature variations than the first clock generator. In one example, the first clock generator is a clock generator based on a ring-oscillator, resistor-capacitor oscillator, inductor-capacitor oscillator, crystal capacitor, or the like. In some examples, the second clock generator is a clock generator based on a phase-locked loop.

For example, when the energy-detecting signal ENERGY_PASS corresponding to a result that the energy level of the signal AUDIO_IN exceeds the predetermined threshold, the power management circuit 140 activates the second clock generator 122 through a peripheral wakeup signal WAKEUP_P. In at least one example, the power management circuit 140 also sets a multiplexer 114 through a multiplexer selection signal MUX_SEL such that the second clock signal CLK2 will be used to drive the microphone circuit 116 and/or the pre-processing circuit 118.

In one example, the settings of the first clock generator 112 are also adjusted by a clock calibrator by comparing the first clocks signal CLK1 and the second clock signal CLK2.

At S750, the second clock generator drives the second circuit, causing the second circuit to determine whether the signal matches a predetermined pattern. For example, the second circuit 120 receives the down-sampled data DS_DATA from the first circuit 110 and determines whether the signal AUDIO_IN, as represented by the down-sampled data DS_DATA, matches a predetermined pattern. In some examples, the down-sampled data DS_DATA is generated by the pre-processing circuit 118 of the first circuit 110 by down-sampling the data MIC_DATA that represent the single MIC_IN.

At S760, when it is determined that the signal matches the predetermined pattern, the process proceeds to S770. When it is determined that the signal does not match the predetermined pattern, the process proceeds to S710.

For example, the pattern detector 126 generates a pattern-matching signal PATTERN_PASS corresponding to a result of whether the signal AUDIO_IN matches the predetermined pattern and outputs the pattern-matching signal PATTERN_PASS to the power management circuit 140. When the pattern-matching signal PATTERN_PASS corresponding to a result that the signal AUDIO_IN matches the predetermined pattern, the power management circuit 140 activates the third circuit 130, and the user device 100 is shifted to a higher power mode. When the pattern-matching signal PATTERN_PASS corresponding to a result that the signal AUDIO_IN does not match the predetermined pattern, the power management circuit 140 does not activate the third circuit 130 and deactivates the second circuit 120, and the user device 100 remains at the lower power mode.

At S770, a third circuit is activated when the second circuit determines that the signal matches the predetermined pattern. For example, the power management circuit 140 activates the third circuit 130 through a main wakeup signal WAKEUP_P when the pattern-matching signal PATTERN_PASS corresponding to a result that the signal AUDIO_IN matches the predetermined pattern.

After S770, the process proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:
   a first clock generator configured to generate a first clock, wherein the first clock drives a first circuit to:
   (i) receive audio data corresponding to an audio input, and
   (ii) determine whether an energy level of the audio data exceeds a predetermined threshold;
   a second clock generator configured to generate a second clock, wherein the second clock drives a second circuit to determine whether the audio data matches a predetermined pattern, wherein the second clock generator is activated when the first circuit determines that the energy level of the audio data exceeds the predetermined threshold, and wherein a frequency of the first clock is lower than a frequency of the second clock; and
   a third circuit with a frequency of a third clock greater than the frequency of the second clock that is activated when the second circuit determines that the audio data matches the predetermined pattern.

2. The apparatus of claim 1, further comprising a power management circuit configured to:
   receive the energy detection signal from the first circuit;
   activate the second clock generator when the energy detection signal indicates that the energy level of the audio data exceeds the predetermined threshold;
   receive a pattern matching signal from the second circuit that indicates whether the audio data matches the predetermined pattern; and
   activate the third circuit when the pattern matching signal indicates that the audio data matches the predetermined pattern.

3. The apparatus of claim 1, wherein
   the first circuit comprises a filter configured to generate down-sampled data based on the audio data, and
   the first circuit is configured to generate derived data based on the down-sampled data.

4. The apparatus of claim 3, wherein
   the first circuit further comprises a squarer circuit configured to generate the derived data by squaring the down-sampled data;
   an integrator circuit configured to generate a detected energy level by integrating the derived data, the integrator circuit being reset every predetermined number of clock cycles to reduce accumulation of noise by the integrator circuit; and
   a threshold comparator configured to generate an energy detection signal by comparing the detected energy level with the predetermined threshold, the energy detection signal indicating whether the energy level of the audio data exceeds the predetermined threshold.

5. The apparatus of claim 1, wherein the first circuit comprises:
   a multiplexer configured to receive the first clock signal from the first clock generator and the second clock signal from the second clock generator and selectively pass one of the first and clock signals to drive the first circuit.

6. The apparatus of claim 1, wherein
   the first circuit is configured to generate down-sampled data by down-sampling the audio data, and
   the second circuit is configured to receive the down-sampled data from the first circuit, and generate a pattern matching signal by comparing the down-sampled data with the predetermined pattern.

7. The apparatus of claim 1, wherein
   a power consumption level of the first clock generator is less than a power consumption level of the second clock generator.

8. The apparatus of claim 1, wherein
   the first clock generator is a ring-oscillator, and
   the second clock generator is a phase locked loop clock generator.

9. The apparatus of claim 1, wherein the second circuit further comprises:
   a clock calibrator configured to adjust a setting of the first clock generator based on comparing the first clock signal from the first clock generator and the second clock signal from the second clock generator.

10. The apparatus of claim 1, wherein the second clock signal from the second clock generator drives the first circuit when the second clock generator is activated.

11. The apparatus of claim 1, wherein the second clock signal from the second clock generator drives the third circuit when the second clock generator is activated.

12. The apparatus of claim 1, further comprising a third clock generator that is activated to generate a third clock signal when the second circuit determines that the audio data matches the predetermined pattern, wherein the third clock signal drives the third circuit.

13. A method of activating various circuits, comprising:
   receiving, by a first circuit driven by a first clock signal generated by a first clock generator, audio data corresponding to an audio input;
   determining, by the first circuit driven by the first clock signal, whether an energy level of the audio data exceeds a predetermined threshold;
   activating a second clock generator to generate a second clock signal when the first circuit determines that the energy level of the audio data exceeds the predetermined threshold, wherein a frequency of the first clock is lower than a frequency of the second clock;
   determining, by the second circuit driven by the second clock signal, whether the audio data matches a predetermined pattern; and
   activating a third circuit with a frequency of a third clock greater than the frequency of the second clock when the second circuit determines that the audio data matches the predetermined pattern.

14. The method of claim 13, further comprising:
receiving the energy detection signal from the first circuit that indicates whether the energy level of the audio data exceeds the predetermined threshold;
activating the second clock generator when the energy detection signal indicates that the energy level of the audio data exceeds the predetermined threshold;
receiving a pattern matching signal from the second circuit that indicates whether the audio data matches the predetermined pattern; and
activating the third circuit when the pattern matching signal indicates that the audio data matches the predetermined pattern.

15. The method of claim 13, further comprising:
generating down-sampled data by down-sampling the audio data; and
generating derived data based on the down-sampled data.

16. The method of claim 13, further comprising:
selectively passing, by a multiplexer of the first circuit, one of the first clock signal from the first clock generator and the second clock signal from the second clock generator to drive the first circuit.

17. The method of claim 13, further comprising:
generating down-sampled data by down-sampling data the audio data; and
generating a pattern matching signal by comparing the down-sampled data with the predetermined pattern.

18. The method of claim 13, further comprising:
adjusting a setting of the first clock generator based on comparing the first clock signal from the first clock generator and the second clock signal from the second clock generator.

19. A non-transitory computer-readable medium storing instructions that, when executed by a processing circuit, cause the processing circuit to perform operations including:
receiving an energy detection signal from a first circuit that is driven by a first clock signal generated by a first clock generator, the energy detection signal indicating whether an energy level of audio data corresponding to an audio input exceeds a predetermined threshold, the energy detection signal being generated according to
generation of a detected energy level by integrating derived data that is derived from the audio data, and
generation of the energy detection signal by comparing the detected energy level with the predetermined threshold;
activating a second clock generator to generate a second clock signal when the energy detection signal indicates that the energy level of the audio data exceeds the predetermined threshold, wherein a frequency of the first clock is lower than a frequency of the second clock;
receiving a pattern matching signal from a second circuit that is driven by the second clock signal generated by the second clock generator, the pattern matching signal indicating whether the audio data matches a predetermined pattern; and
activating a third circuit with a frequency of a third clock greater than the frequency of the second clock when the pattern matching signal indicates that the audio data matches the predetermined pattern.

20. The non-transitory computer-readable medium of claim 19, wherein the instructions, when executed by the processing circuit, further cause the processing circuit to perform the operations including:
setting a multiplexer to selectively pass one of the first clock signal from the first clock generator and the second clock signal from the second clock generator to drive the first circuit based on the energy detection signal.

* * * * *